United States Patent [19]

Bienia et al.

[11] Patent Number: 4,760,214
[45] Date of Patent: Jul. 26, 1988

[54] CONTACTING ARRANGEMENT FOR SHIELDED COMPARTMENTS AND SPACES WITH HF-TIGHT SHIELDED, MOVABLE AND ABUTTING HOUSING COMPONENTS

[75] Inventors: Richard Bienia, Wenzenbach; Rudolf Schaller, Alteglofsheim, both of Fed. Rep. of Germany

[73] Assignee: Siemens Aktiengesellschaft, Berlin and Munich, Fed. Rep. of Germany

[21] Appl. No.: 835,846

[22] Filed: Mar. 3, 1986

[30] Foreign Application Priority Data

Apr. 12, 1985 [DE] Fed. Rep. of Germany ....... 3513186

[51] Int. Cl.⁴ .............................................. H05K 9/00
[52] U.S. Cl. ............................................... 174/35 GC
[58] Field of Search ...................... 174/35 GC, 35 MS; 49/483; 219/10.55 D

[56] References Cited

U.S. PATENT DOCUMENTS

| | | | |
|---|---|---|---|
| 2,477,267 | 7/1949 | Robinson | 174/35 GC |
| 3,277,230 | 10/1966 | Stickney et al. | 174/35 |
| 3,304,360 | 2/1967 | Hadley et al. | 174/35 |
| 3,589,070 | 6/1971 | Hansen et al. | 174/35 MS |
| 3,866,009 | 2/1975 | Ishino et al. | 219/10.55 D |
| 4,046,983 | 9/1977 | Ishino et al. | 219/10.55 D |
| 4,069,618 | 1/1978 | Geiss | 49/483 |
| 4,602,141 | 7/1986 | Naito et al. | 219/10.55 D |

FOREIGN PATENT DOCUMENTS

| | | |
|---|---|---|
| 0095743 | 12/1983 | European Pat. Off. . |
| 2451192 | 2/1976 | Fed. Rep. of Germany . |
| 2601277 | 7/1976 | Fed. Rep. of Germany . |
| 1505579 | 10/1975 | United Kingdom . |

OTHER PUBLICATIONS

D. E. Yates and R. P. Zitsch, Radio Interference Gasket, RCA Technical Note #189, Aug. 1955.

Gasket Improves RFI Shielding, May 3, 1965, pp. 120 & 122, Electronics, vol. 38, No. 9.

M. A. Lockhart, Fingerstock Expander, Aug. 1969, IBM Technical Disclosure, vol. 12, No. 3.

Metex Shielding Products, May 1955, pp. 10-11, Metex Textile Corporation, Roselle, NJ.

Siemens AG Brochure Entitled, "EMV Raumabschirmung Kabinen, Bauteile, Filter", dated 1983/84, pp. 26 to 29.

Primary Examiner—Arthur T. Grimley
Assistant Examiner—David A. Tone
Attorney, Agent, or Firm—John F. Moran

[57] ABSTRACT

A contacting arrangement for shielded compartments and regions with HF-tight shielded movable and abutting housing components (1, 2), particularly door sashes, door leaves, window wings and window frames, which overlap at their edge regions and which are shielded along the edge regions (1, 2) through a first contacting system (5, 6, 6), particularly through a blade contact system with a blade like projection (5) on one of the housing components (2) and contact springs (6, 6) on the other housing component (1) which engage each other in the contacting position, and additionally through a second contacting system (20) mounted in the overlapping region of the housing components (1, 2) which is displaced outward with respect to the first contacting system (5, 6, 6). An elastic absorbing material (14) is provided in the region between the two contacting systems which is attached to one of the abuttable movable housing components (1, 2). An encompassing stiffening frame (33) attached to one of the housing parts (1) serves as a carrier for the second contacting system (20) and one section of the first contacting system (5, 6, 6) and overlaps with the second housing section (2) in its edge region.

4 Claims, 2 Drawing Sheets

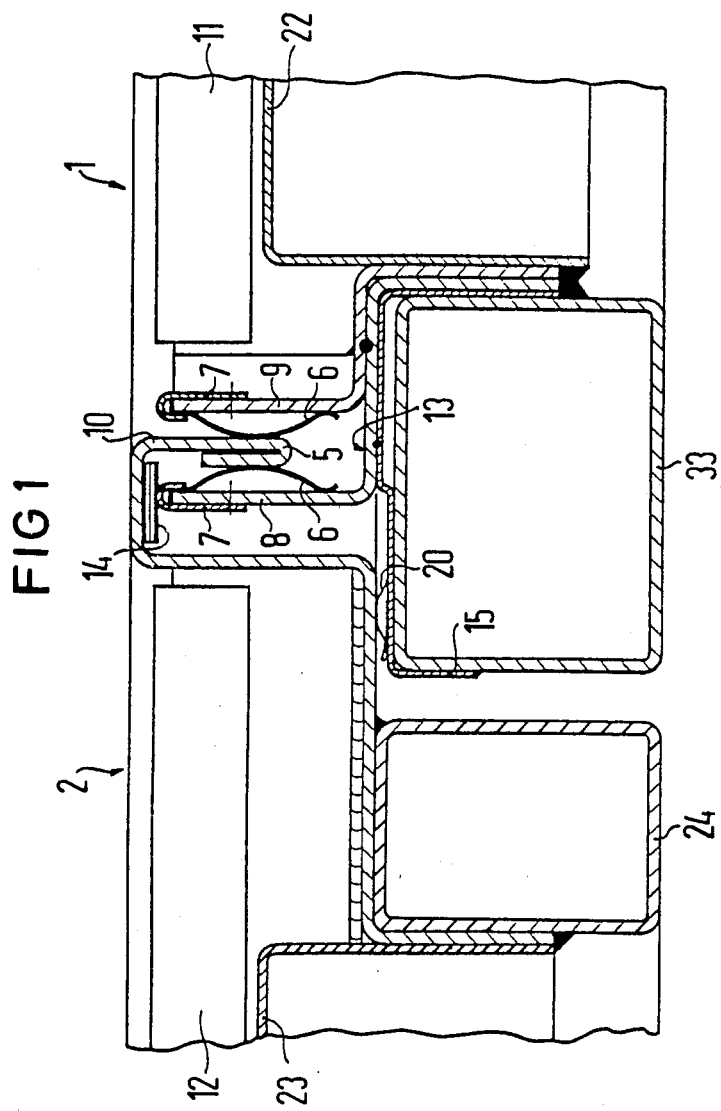

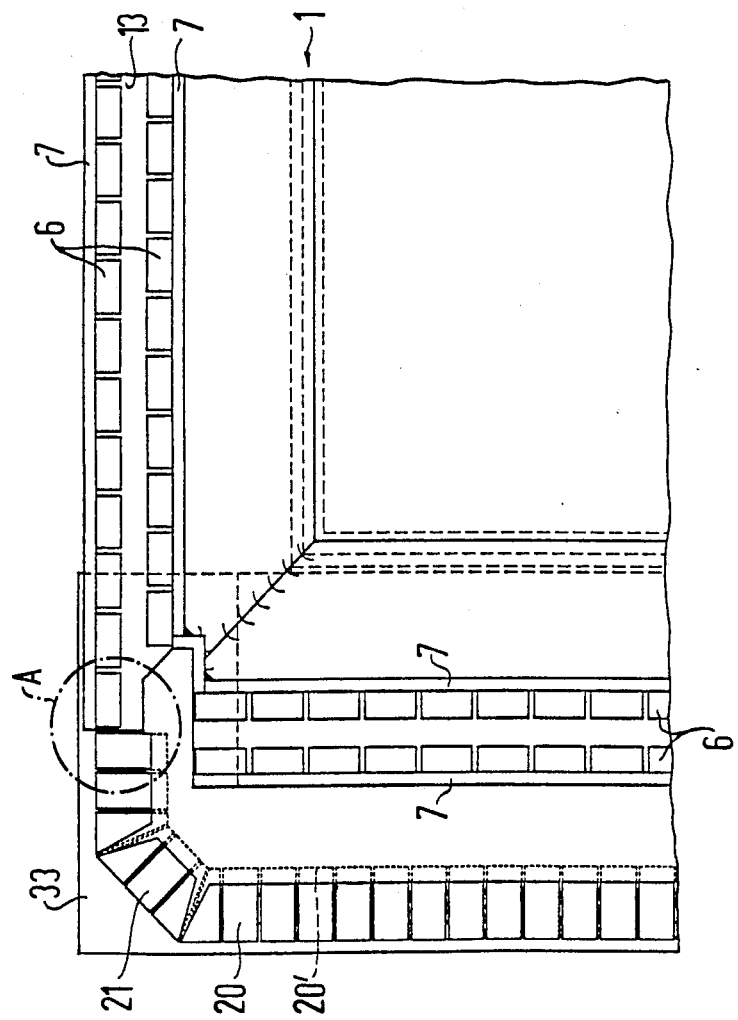

CONTACTING ARRANGEMENT FOR SHIELDED COMPARTMENTS AND SPACES WITH HF-TIGHT SHIELDED, MOVABLE AND ABUTTING HOUSING COMPONENTS

BACKGROUND OF THE INVENTION

This invention relates to a contacting arrangement for shielded compartments and spaces with movable and abutting housing components. More particularly, the invention relates to contacting arrangements for door sashes, door leaves, window wings and window frames, of the type which overlap at their edge regions and which engage each other at the contact regions of the movable housing components provided, in the closed position, through a first provided contacting system, particularly a blade contacting system with a blade like projection on one housing component and contact springs on the other housing component. Additionally, shielding is provided through a second contacting system arrangement in the overlapping region of the housing components which is displaced outward relative to the first contacting system and which is effective, particularly in the corner regions, in providing continuous contact.

An example of a conventional contacting arrangement of this type is disclosed in the European patent application no. 0095743.

In the fields of communications and high frequency technology, it is of fundamental importance and often necessary to prevent the propogation of electric and magnetic fields in particular spatial regions in which they may disturb or interfere with operations. It is therefore frequently necessary to protect individual equipment by shielding. For example, broadcast receivers or sensitive measuring equipment is protected from electrical disturbing influences or interference by enclosing them in shielded compartments or cages, or to equip complete spaces or regions with shielding. Complete shielding for electrostatic fields is provided through thin metal foils while magnetic or magnetostatic fields are attenuated in spaces or regions using walls comprised of ferromagnetic materials.

Since the shielding at contacting locations between stationary and movable or between movable and abutting space shielding is less effective than in continuous or unbroken wall areas, these contacting locations generally represent the least attenuated regions. Examples of these locations are areas between window frames and window wings, between door sashes and door leaves and/or between two window wings or door leaves. As a result, there is a continuing need to improve the effectiveness of shielding associated with these contacting regions.

It is of paramount importance, especially in the high frequency bands in the MHz and GHz regions that these contact arrangements are made as gap-free as possible in the regions of various closing corners of the housing components. For example, one problem area is in the case of doors with sashes contacting the frames of the movable abutting housing components and free of interference. Difficulties of contact arise especially in connection with two winged doors in the area of the principal closing corner, that is in the area of the mating corner between the movable and stationary wings and the door sill and/or the door lintel. Gaps frequently appear here, on the order of several mm in width, which cannot be bridged and closed through use of most of the conventional and existing contacting arrangements. This problem is typically and commonly encountered in the use of conventional spring contacting arrangements. As a result, the effectiveness of shielding in the high frequency region is substantially reduced. The present state of the art in conventional contacting arrangements is represented by the arrangement disclosed in European patent application no. 0095743.

SUMMARY OF THE INVENTION

An object of the present invention is to provide an improved contacting arrangement over the conventional type which provides better attenuating properties as well as shielding properties.

Another object of the present invention is to provide an improved arrangement which also features improved construction.

The present invention takes the form of a contacting arrangement which employs an elastic absorbing material between the two contacting systems. The contacting arrangement is secured to one of two abutting shielded housing components having relative motion therebetween, and which, as a carrier for the second contacting system and as part of the first contacting system, is provided with an encompassing stiffening frame fastened to one of the housing components which overlaps with the other housing component in the region of its edges.

As a second contacting system, strip formed continuous contacting springs, a strip formed metal mesh or an elastic conducting strip may be provided which extend along the inadequately high frequency-tight, or HF-tight, open gaps and are also especially placed in the corner regions.

Through the absorbing elastic material placed between the two contacting systems, complete additional shielding is provided which is able to compensate for irregularities during fabrication. Finally, the stiffening frame ensures the necessary stability of the contacting elements of the individual contacting systems to each other.

BRIEF DESCRIPTION OF THE DRAWING

Features of the invention and additional objects of the invention will be more readily appreciated and better understood by reference to the following detailed description which should be considered in conjunction with the drawing.

FIG. 1 is a partial cut and sectional view of a double winged door with a contacting provision in accordance with the invention.

FIG. 2 is a partial sectional view illustrating further details of the movable wing in accordance with FIG. 1 with the contacting provision according to the invention.

DETAILED DESCRIPTION

The double winged door in accordance with FIG. 1 is comprised of moving wing 1 and stationary wing 2, which, for example, illustrate mineral wool filled frame elements 22, 23, upper panels 11, 12 and surrounding stiffening frames 24, 33 with a rectangular cross section. The stiffening frame 33 is elongated, with concurrent foreshortening of the stiffening frame 24 of the stationary wing 2, in the direction of the stationary wing 2. Through this means an overlap is produced in the regions of the contacting corners of both wings, which simplifies the arrangement of a second contacting system between the abutting and moving housing components, that is not between the wings, but rather between wings and the door sash.

The high-frequency (HF) tight first contacting provision for this double winged door includes a blade like extension 5, which, in the closed position, projects into a channel 13 and rests by compressional force fit against contact springs on both sides which are held in place by contact spring supports 6, 6. These contact springs make good electrical contact with the channel 13, are arched in the direction of the blade-like extension 5 and are, for example, pressed against the side walls 8 and/or 9 of the channel 13 by the hook-formed clamping elements 7, 7. The side walls 8, 9 of the channel 13 and the blade-like extension 5 are correspondingly formed of preformed sheet metal, the ends of which are turned away from the contacting provision in the illustrative embodiment and clamped and welded HF-tight between the stiffening frame 24 and/or 33 and the frame element 23 and/or 22.

While in the closed position of the door, the side wall 8 of the channel 13 with its clamping element 7 lies against a damping stop plate 14, attached to the sheet metal 10. In order to improve the damping characteristics, the stop 14 is made of an elastic strip like HF-absorbing material, e.g. of electrically conducting foam rubber.

The second contacting system, which is displaced outward relative to the first and is carried by the stiffening frame 33, may for example, be a continuous contact spring support shoulder 20 that is attached intermediately to the stiffening frame 33 through a profiled sheet metal piece 15.

In FIG. 2, in which the stationary wing 2 is not shown for the sake of clarity, it is evident that the contact spring support shoulder 20 shown in dashed lines in the closed position 20' makes complete contact and therefore shielding possible in the corner region 21 as well.

In this illustrative embodiment of FIG. 2, it may be observed that the second contacting arrangement is moved against the first contacting arrangement as designated in area A. Conceivable, and indeed without additional construction costs, is an encompassing arrangement of the second contacting system and therewith also contact in the regions of the adjacent closing corners of the doors. If necessary, the contact spring shoulder 20 can be replaced by a strip-formed metal mesh or an elastic conducting strip.

These contacting arrangements not only satisfy the shielding requirements at low and mid-frequencies, but also satisfy requirements amply at high frequency, that is in the MHz/GHz frequency regions. Thus, for example, wide ranging gap-free contacting is ensured for the associated elements in the region of the principal closing edges, that is the contacting edge between the moving and stationary wings 1 and/or 2 in the region of the adjacent closing edges, or the region of the mating edges between the door and the door sill, and the door and the door lintel, and also in the corner regions of the doors. The elastic absorbing material that is placed between the two contacting systems completes the shielding.

There has thus been shown and described a novel contact arrangement for shielding against electromagnetic radiation which fulfills all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

We claim:

1. In a shielded housing enclosure for high frequency (HF) radiation having a first shielded housing component and a second shielded housing component wherein there is relative movement between the first and second shield housing components, a contacting arrangement located between overlapping edge regions of the shielded housing components comprising a first contacting system for shielding along the edge regions of the shielded housing components, the first contacting system having a blade shaped projection on one of the shielded housing components and contact springs on the other of the shielded housing components, the blade shaped projection engaging between the contact springs while in a contacting position, the contacting arrangement comprising a second contacting system located to one side of the first contacting system and in the overlapped region of the shielded housing components for providing a continuous contact including corner regions, and the contacting arrangement in the overlapped region including an elastic radiation absorbing material located in a region between the the first and second contacting systems and fastened to one of the two shielded housing components, and a surrounding stiffening frame being provided for supporting the second contacting system and a part of the first contacting system that overlaps the other housing component in its edge region.

2. A contacting arrangement in accordance with claim 1, wherein continuous strip formed contact springs shaped as contact spring support shoulders are provided as the second contacting system.

3. A contacting arrangement in accordance with claim 1, comprising a strip formed metal mesh being provided as the second contacting system.

4. A contacting arrangement in accordance with claim 1, comprising an elastic conductive strip being provided as the second contacting system.

* * * * *